United States Patent [19]

Sandhu

[11] Patent Number: 5,229,666
[45] Date of Patent: Jul. 20, 1993

[54] SINGLE-ENDED COMPLEMENTARY MOSFET SENSE AMPLIFIER

[75] Inventor: Bal S. Sandhu, Fremont, Calif.

[73] Assignee: National Semiconductor Corporation, Santa Clara, Calif.

[21] Appl. No.: 777,025

[22] Filed: Oct. 16, 1991

[51] Int. Cl.$^5$ .................. H03F 3/45; H03K 5/12; H03K 3/01

[52] U.S. Cl. .................. 307/530; 307/263; 307/296.8

[58] Field of Search ............. 307/263, 530, 605, 296.8

[56] References Cited

U.S. PATENT DOCUMENTS

| | | | |
|---|---|---|---|
| 4,471,242 | 9/1984 | Noufer et al. | 307/475 |
| 4,763,026 | 8/1988 | Tsen et al. | 307/530 |
| 4,823,031 | 4/1989 | Kadakia | 307/530 |
| 4,918,341 | 4/1990 | Galbraith et al. | 307/530 |
| 4,929,853 | 5/1990 | Kim et al. | 307/475 |
| 5,013,943 | 5/1991 | Hirose | 307/530 |

*Primary Examiner*—Jin F. Ng
*Assistant Examiner*—Sinh Tran
*Attorney, Agent, or Firm*—Limbach & Limbach

[57] ABSTRACT

A single-ended complementary MOSFET sense amplifier having improved immunity from trip current variations, ground bounce and noise with minimal switching speed degradation includes complementary MOSFET amplifiers and a reference-controlled output amplifier comprising a voltage reference-controlled inverter. Complementary MOSFETs exclusively are used to avoid nonuniform depletion doping effects of NMOS depletion mode FETs. The input stage is designed to require a higher bit line signal voltage amplitude for higher noise immunity. The output stage is a single-ended voltage reference-controlled inverter with reduced sensitivity to CMOS process-induced MOSFET performance variations, and which has a higher input switching threshold for enhanced ground bounce immunity. In a preferred embodiment, the input stage provides voltage level shifting for increasing the dynamic range of the signal driving the output stage, thereby maintaining high switching speed.

3 Claims, 4 Drawing Sheets

SINGLE-ENDED COMPLEMENTARY MOSFET SENSE AMPLIFIER

BACKGROUND OF THE INVENTION

1. Field of the Invention

The present invention relates to sense amplifiers, and in particular, to single-ended complementary metal oxide semiconductor field effect transistor ("MOSFET") sense amplifiers.

2. Description of the Related Art Referring to FIG. 1, a conventional sense amplifier circuit design is illustrated in which N-type MOSFETs ("N-MOSFETs") are used. Enhancement mode N-MOS FETs Q1.1-Q1.4, Q1.6-Q1.8, Q1.10, Q1.12 and depletion mode N-MOSFETs Q1.5, Q1.9, Q1.11 are interconnected in five stages as shown. The MOSFET geometries, e.g. the channel widths and lengths, are as shown below in Table 1.1.

TABLE 1.1

(PRIOR ART)

| MOSFET | CHANNEL WIDTH (MICRONS) | CHANNEL LENGTH (MICRONS) |
|---|---|---|
| Q1.1 | 17.8 | 2 |
| Q1.2 | 6.5 | 2.7 |
| Q1.3 | 22 | 2.5 |
| Q1.4 | 10 | 2 |
| Q1.5 | 7 | 5.3 |
| Q1.6 | 40 | 2.5 |
| Q1.7 | 27 | 2.5 |
| Q1.8 | 33 | 2.5 |
| Q1.9 | 7 | 7 |
| Q1.10 | 10 | 2.5 |
| Q1.11 | 10 | 3.5 |
| Q1.12 | 30 | 2.0 |

The circuit of FIG. 1 is biased between power supplies VDD and VSS, where the positive supply VDD is typically set equal to a nominal VCC value of five volts, and the negative supply VSS is typically set at circuit reference, or ground GND. A programming, or enablement, control input PZ drives the gates of Q1.1 and Q1.4. This input PZ is typically set at a logical high value (approximately equal to VCC) when the circuit is in a read mode. The input signal V1.1 is the input voltage signal received from a bit line of a memory cell (not shown).

The input voltage V1.1 has two values, a logical 1 in the erase mode, and a logical 0 in the program mode, and is applied to the gates of Q1.3, Q1.6 and Q1.8, as shown. This produces an amplified corresponding signal voltage V1.2 of opposite polarity, or signal phase, which is applied to the gates of Q1.2, Q1.5 and Q1.7, as shown. An amplified and inverted (with respect to the input voltage V1.1) signal voltage V1.3 is produced, which is applied to the gate of Q1.10. (This voltage V1.3 has a voltage level which is lower than voltage V1.2 by the threshold voltage of Q1.7.) The resulting signal, a further amplified and inverted signal voltage V1.4, is applied to the gate of Q1.12 to finally produce the output signal voltage V1.5, which is the digital output signal having logic voltage levels approximately equal to zero and VCC volts. Typical voltage values for these voltages V1.1-V1.5, as well as the typical supply current $I_{S1}$ for this circuit, are shown below in Table 1.2, for the VCC and temperature indicated.

TABLE 1.2

(PRIOR ART)

| INPUT STATE | V1.1 (volts) | V1.2 (volts) | V1.3 (volts) | V1.4 (volts) | V1.5 (volts) | $I_{S1}$ (microamperes) |
|---|---|---|---|---|---|---|
| ERASE ("1") | 1.098 | 2.523 | 1.372 | 2.462 | 0.21 | 1220 |
| PROGRAM ("0") | 1.085 | 2.822 | 1.658 | 0.361 | 4.96 | 728 |

Test Conditions:
VCC = 5.0 Volts
Temperature = 27° C.

The single-ended N-MOSFET sense amplifier of FIG. 1, with the MOSFET geometries as listed above in Table 1.1 and signal voltage levels as listed above in Table 1.2, provides reasonably good switching speed, i.e. reasonably low input-to-output signal propagation delay. Exemplary transition delay times from input pin to output pin (i.e. for a full IC simulation including additional circuitry external to the circuit of FIG. 1) under various VCC and ambient temperature conditions are shown below in Table 1.3

TABLE 1.3

(PRIOR ART)

| TRANSITION | | DELAY TIME (full IC) | |
|---|---|---|---|
| INPUT | OUTPUT | (nanoseconds) | CONDITIONS |
| L→H | H→L | 7.1 | VCC = 4.75 volts |
| H→L | L→H | 6.8 | Temp. = 55° C. |
| L→H | H→L | 7.5 | VCC = 4.75 volts |
| H→L | L→H | 7.4 | Temp. = 85° C. |
| L→H | H→L | 6.4 | VCC = 5.25 volts |
| H→L | L→H | 5.4 | Temp. = 0° C. |

Where:
H = logical one ("1")
L = logical zero ("0")

Accordingly, typical sense amplifiers currently available generally offer performance characteristics and speed sufficient for today's programmable logic devices. However, a number of problems still exist, particularly for single-ended complementary MOSFET sense amplifiers.

One problem involves variations in trip current for the sense amplifier. Trip current tends to vary across a semiconductor wafer by approximately ±15 microamperes. This variation is a function of the depletion current dose and the effective channel length of the MOSFETs integrated onto the wafer. Such trip current variation is particularly evident when depletion mode MOSFETs are used, such as depletion mode N-MOSFETs.

A second problem involves the voltage swing required on the bit line to trip the sense amplifier. This voltage swing can often be as low as five millivolts, which results in a very low noise margin for the sense amplifier.

Still another problem encountered in many sense amplifier designs is oscillation or instability due to "ground bounce" effects. This often occurs when some of the output signal (e.g. from devices downstream in the signal path) feeds back into one or more of the input or intermediate stages of the sense amplifier by way of shared ground paths. While this can often be a function of circuit layout, it is also a function of static voltage levels and threshold voltage levels among the various stages of the sense amplifier.

SUMMARY OF THE INVENTION

A single-ended MOSFET sense amplifier in accordance with the present invention includes an input amplifier for receiving and amplifying a signal from a bit line and a reference-controlled, single-ended output amplifier for providing a reference-controlled, single-ended digital output signal representing the bit line signal. In accordance with the present invention, the reference-controlled, single-ended output amplifier receives an active reference signal which is an active reference bias voltage, or alternatively an active reference-controlled current. In a preferred embodiment of the present invention, the active reference signal is provided by an active reference signal generator comprising a plurality of diode-connected MOSFETs.

The present invention further includes the use of complementary MOSFET devices exclusively throughout the sense amplifier, thereby avoiding non-uniform depletion doping effects of N-MOSFETs.

These and other features and advantages of the present invention will be understood upon consideration of the following detailed description of the invention and the accompanying drawings.

DETAILED DESCRIPTION OF THE INVENTION

Figure 2:
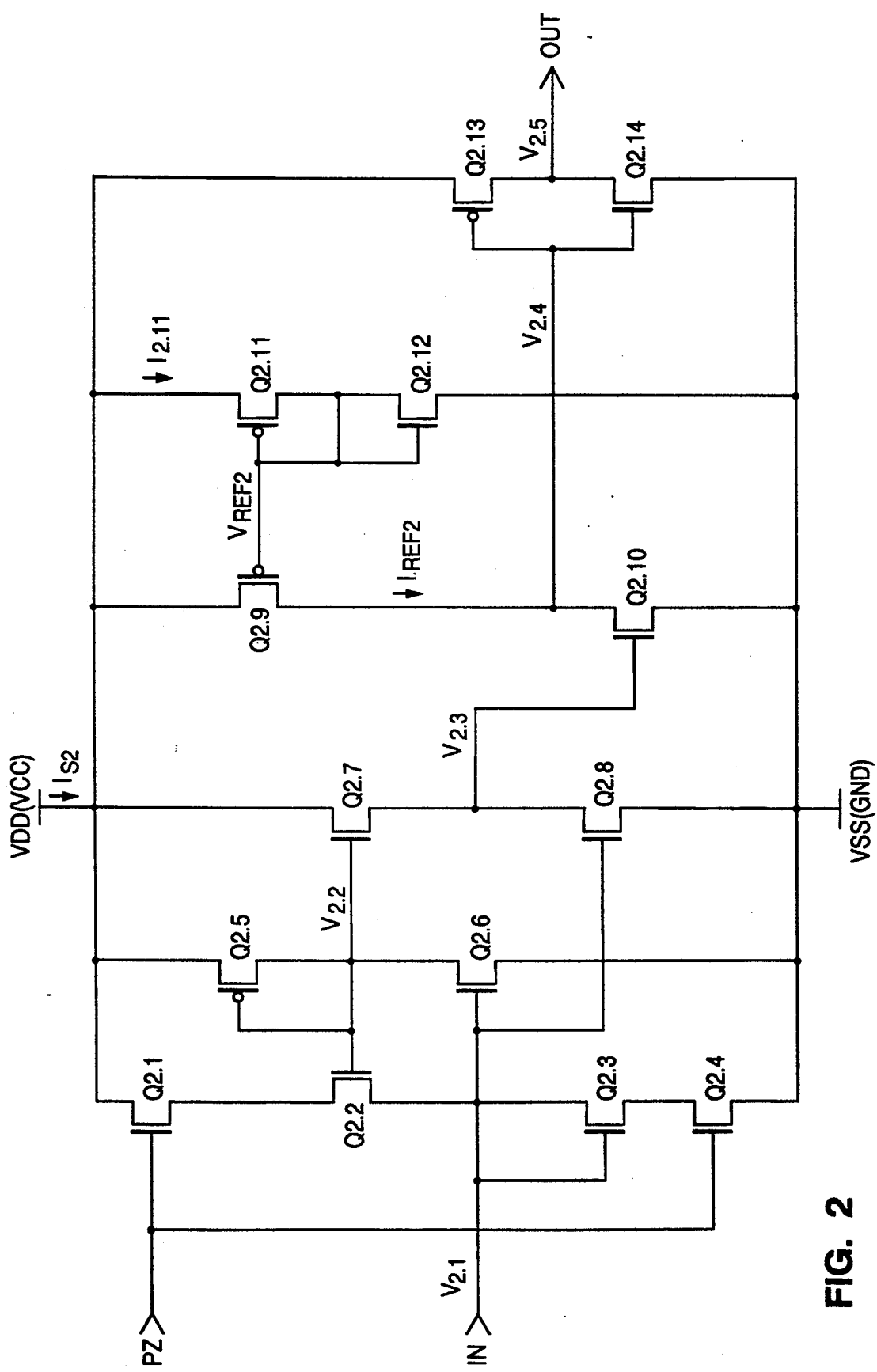
FIG. 2 is a schematic diagram of a preferred embodiment of a single-ended MOSFET sense amplifier in accordance with the present invention.

Referring to FIG. 2, a preferred embodiment of a single-ended MOSFET sense amplifier in accordance with the present invention includes a plurality of active components in the form of complementary MOSFETs Q2.1–Q2.14, including N-MOSFETs Q2.1–Q2.4, Q2.6–Q2.8, Q2.10, Q2.12, Q2.14, and P-MOSFETs Q2.5, Q2.9, Q2.11, Q2.13, connected substantially as shown. The MOSFET geometries, i.e. channel widths and lengths, are as shown below in Table 2.1.

TABLE 2.1

| MOSFET | CHANNEL WIDTH (MICRONS) | CHANNEL LENGTH (MICRONS) |
|---|---|---|
| Q2.1 | 18 | 2 |
| Q2.2 | 6.5 | 2.7 |
| Q2.3 | 12 | 2.5 |
| Q2.4 | 25 | 2 |
| Q2.5 | 10 | 2.5 |
| Q2.6 | 40 | 2.5 |
| Q2.7 | 9 | 2.5 |
| Q2.8 | 10 | 2.5 |
| Q2.9 | 10 | 2.5 |
| Q2.10 | 20 | 2.5 |
| Q2.11 | 3 | 6 |
| Q2.12 | 3 | 12 |
| Q2.13 | 10 | 2.5 |
| Q2.14 | 15 | 2.5 |

The circuit of FIG. 2 is biased between two power supply potentials VDD and VSS, typically set at VCC=5 volts and circuit ground potential GND, respectively. The circuit draws a power supply current $I_{S2}$. The program, or enablement, control input PZ drives the gates of MOSFETs Q2.1 and Q2.4. This input PZ is normally at a logical 1 level (approximately equal to VCC) to enable, or fully turn on, MOSFETs Q2.1 and Q2.4 for normal read operation of the circuit of FIG. 2. The input signal voltage V2.1 produces an output signal voltage V2.5, as well as a number of interstage signal voltage levels V2.2, V2.3, V2.4. As discussed further below, interstage signal voltage level V2.4 is dependent upon an active reference voltage $V_{REF2}$, which in turn, controls an active reference current $I_{REF2}$.

As can be seen in FIG. 2, complementary MOSFETs, i.e. enhancement mode P-MOSFETs and N-MOSFETs, have been used exclusively to construct this single-ended MOSFET sense amplifier. This feature is advantageous where a number of such sense amplifiers are integrated and fabricated on a single wafer. Such exclusive use of complementary MOSFETs avoids non-uniform depletion doping effects of depletion mode MOSFETs.

The sense amplifier circuit of FIG. 2, with the MOSFET geometries shown above in Table 2.1, has a nominal static input voltage V2.1 level of approximately 1.14 volts, and a switching amplitude threshold of approximately 0.03 volts peak. Thus, as shown below in Table 2.2, when the input state is a logical 1 for the erase mode, the input voltage V2.1 is a nominal 1.174 volts, and when the input state is a logical 0 for the program mode, the input voltage V2.1 is a nominal 1.111 volts. The interstage voltages V2.2–V2.4 and output voltage V2.5 then have nominal values as shown below in Table 2.2, for the test conditions indicated.

TABLE 2.2

| INPUT STATE | V2.1 (volts) | V2.2 (volts) | V2.3 (volts) | V2.4 (volts) | V2.5 (volts) | $I_{S2}$ (microamperes) |
|---|---|---|---|---|---|---|
| ERASE ("1") | 1.174 | 2.613 | 1.394 | 3.641 | 0.02 | 977 |
| PROGRAM ("0") | 1.111 | 2.829 | 1.652 | 0.519 | 4.92 | 1050 |

Test Conditions:
VCC = 5.0 Volts
Temperature = 27° C.

The stage comprising Q2.1–Q2.4 serves as a column line reference stage by establishing the quiescent dc voltage level for the input voltage V2.1 on the bit line of a memory cell (not shown). The stage comprising Q2.5 and Q2.6 serves as a gain stage by amplifying the voltage levels of the input voltage V2.1 to produce interstage voltage V2.2. The stage comprising Q2.7 and Q2.8 serves as an inverter by inverting the voltage levels of the input voltage V2.1 to produce interstage voltage V2.3. Thus, MOSFETs Q2.5–Q2.8 serve collectively as an amplifying inverter since their "output" voltage V2.3 is amplified and inverted with respect to the input voltage V2.1.

The single-ended N-MOSFET sense amplifier of FIG. 2, with the MOSFET geometries as listed above in Table 2.1 and signal voltage levels as listed above in Table 2.2, maintains good switching speed, i.e. low input-to-output signal propagation delay. Exemplary transition delay times from input pin to output pin (i.e. for a full IC simulation including additional circuitry external to the circuit of FIG. 2) under various VCC and ambient temperature conditions are shown below in Table 2.3.

TABLE 2.3

| TRANSITION | | DELAY TIME (full IC) | |
|---|---|---|---|
| INPUT | OUTPUT | (nanoseconds) | CONDITIONS |
| L→H | H→L | 7.2 | VCC = 4.75 volts |
| H→L | L→H | 6.9 | Temp. = 55° C. |
| L→H | H→L | 7.6 | VCC = 4.75 volts |
| H→L | L→H | 7.5 | Temp. = 85° C. |
| L→H | H→L | 6.3 | VCC = 5.25 volts |
| H→L | L→H | 5.5 | Temp. = 0° C. |

Where:
H = logical one ("1")
L = logical zero ("0")

An advantageous feature of the single-ended MOSFET sense amplifier circuit of FIG. 2 is the source of a reference bias voltage $V_{REF2}$ and active reference-controlled current $I_{REF2}$ formed by MOSFETs Q2.9, Q2.11 and Q2.12. MOSFETs Q2.11 and Q2.12 are diode-connected, complementary MOSFETs Which, when connected between the power supply VCC and circuit ground GND produce an active reference voltage $V_{REF2}$ for biasing the gate of MOSFET Q2.9. This produces an active reference-controlled current $I_{REF2}$ for supplying the drain of driver MOSFET Q2.10. Alternatively, the interconnection of Q2.9, Q2.11 and Q2.12 as shown in FIG. 2 can be referred to as a current mirror, wherein the drain current $I_{2.11}$ of MOSFET Q2.11 is replicated, or "mirrored," in the active reference-controlled current $I_{REF2}$.

Figure 1:
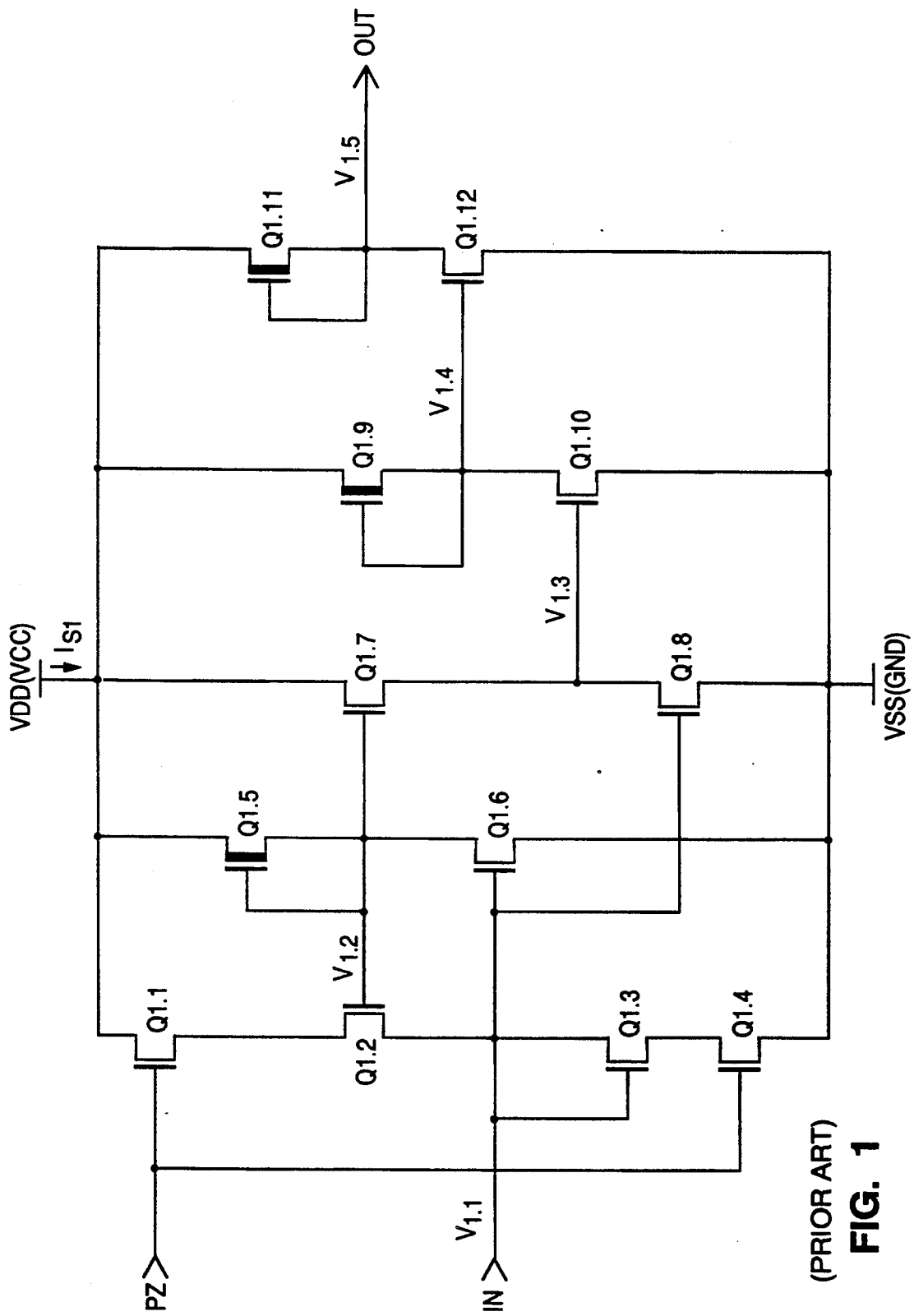
FIG. 1 is a schematic diagram of a conventional single-ended N-MOSFET sense amplifier.

In accordance with the present invention, this use of an active reference (active reference bias voltage $V_{REF2}$ or active reference-controlled current $I_{REF2}$) advantageously provides a number of benefits. One benefit is that the use of active components in the form of the diode-connected MOSFETs Q2.11 and Q2.12 will track processing variations among the remaining N-MOSFETs and P-MOSFETs, thereby minimizing trip current variations at the input signal V2.1. Another benefit is that the MOSFET geometries of the reference MOSFETs Q2.9, Q2.11 and Q2.12 can be designed to specifically set the interstage voltage V2.4 at the drain of driver MOSFET Q2.10. For example, for the MOSFET geometries shown above in Table 2.1 for the circuit of FIG. 2, it can be seen that the interstage voltage V2.4 is significantly higher than the corresponding interstage signal voltage V1.4 of FIG. 1 (see Table 1.2). This advantageously reduces "ground bounce" effects which are due to output signal energy feeding back into intermediate stage devices Q2.3, Q2.4, Q2.6, Q2.8 and Q2.10 via their common ground paths when output MOSFETs Q2.13 and Q2.14 switch the output signal voltage V2.5 from a logic high to a logic low. This is particularly advantageous since such "ground bounce" effects are further aggravated by additional output signal energy feeding back from subsequent stages and devices (not shown) downstream in the signal path.

The elevated nominal static and threshold switching values for the input signal voltage V2.1, as well as the interstage voltages V2.2–V2.4, are advantageous. Higher nominal static voltage levels are helpful in that the aforementioned "ground bounce" effects feeding back from the output MOSFETs Q2.13, Q2.14 and subsequent stages downstream in the signal path (not shown) are reduced. Further, having the higher and lower switching thresholds for the erase and program modes, respectively, provide for increased noise immunity, i.e. a higher noise margin, for the input stage (e.g. MOSFET Q2.3).

Figure 3:
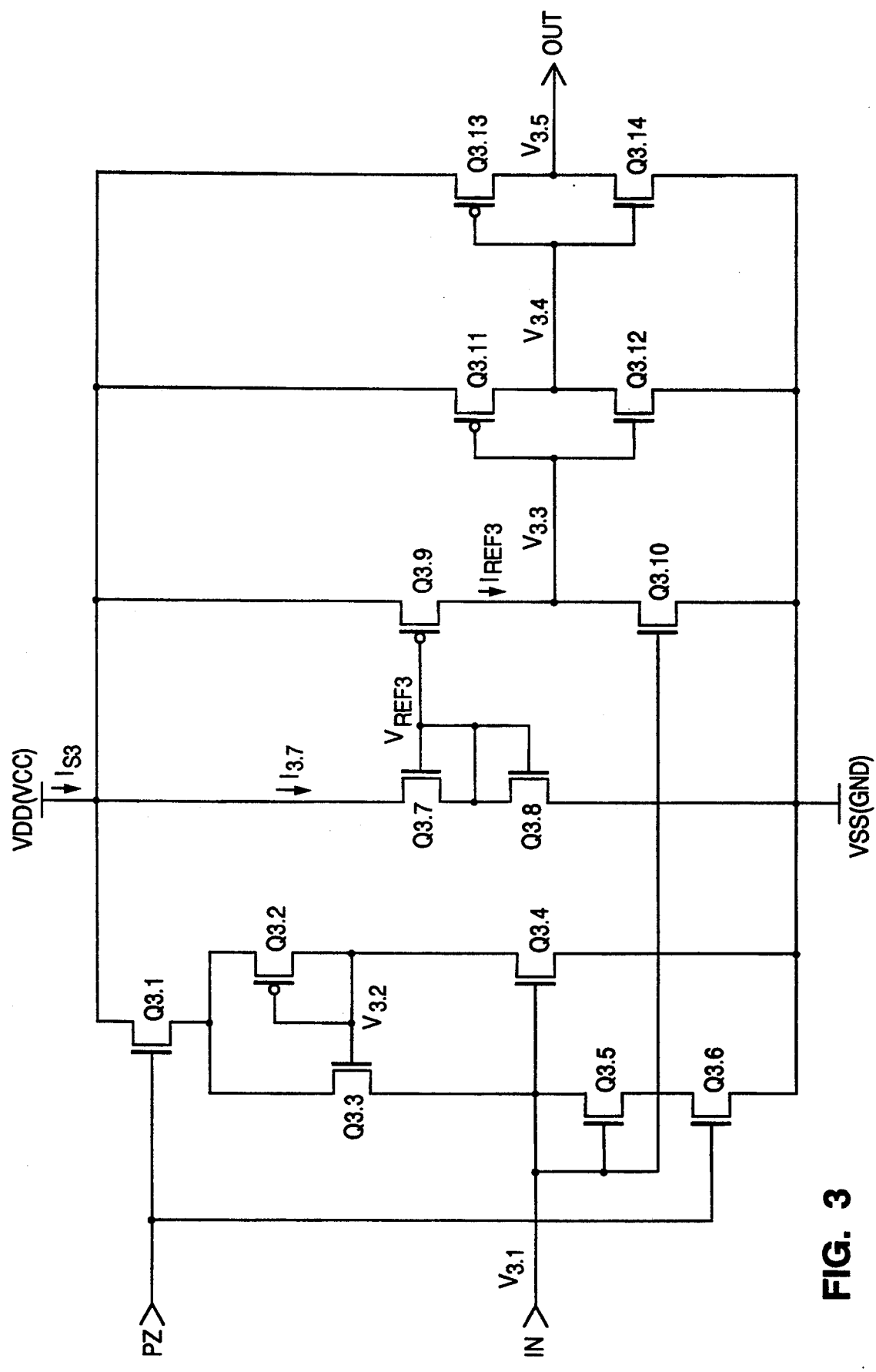
FIG. 3 is a schematic diagram of an alternative embodiment of a single-ended MOSFET sense amplifier in accordance with the present invention.

Referring to FIG. 3, an alternative embodiment of a single-ended MOSFET sense amplifier in accordance with the present invention includes pluralities of P-MOSFETs Q3.2, Q3.7, Q3.9, Q3.11, Q3.13 and N-MOSFETs Q3.1, Q3.3–Q3.6, Q3.8, Q3.10, Q3.12, Q3.14, connected substantially as shown. The MOSFET geometries and circuit performance characteristics are shown below in Tables 3.1-3.3. With the MOSFET geometries as shown below in Table 3.1, the reference voltage $V_{REF3}$ is approximately 2.4 volts, and the active reference current $I_{3.7}$ is approximately 30 micro-amperes.

TABLE 3.1

| MOSFET | CHANNEL WIDTH (MICRONS) | CHANNEL LENGTH (MICRONS) |
|---|---|---|
| Q3.1 | 25 | 2 |
| Q3.2 | 20 | 2.5 |
| Q3.3 | 7 | 2.5 |
| Q3.4 | 15 | 2.5 |
| Q3.5 | 5 | 2.5 |
| Q3.6 | 10 | 2 |
| Q3.7 | 3 | 6 |
| Q3.8 | 3 | 12 |
| Q3.9 | 6 | 3 |
| Q3.10 | 30 | 2.5 |
| Q3.11 | 6 | 2.5 |
| Q3.12 | 10 | 2.5 |
| Q3.13 | 10 | 2.5 |
| Q3.14 | 15 | 2.5 |

TABLE 3.2

| INPUT STATE | V3.1 (volts) | V3.2 (volts) | V3.3 (volts) | V3.4 (volts) | V3.5 (volts) | $I_{S3}$ (micro-amperes) |
|---|---|---|---|---|---|---|
| ERASE ("1") | 1.193 | 2.34 | 1.16 | 4.74 | 0 | 490 |
| PROGRAM ("0") | 1.068 | 2.5 | 3.92 | 0.01 | 5 | 395 |

Test Conditions:
VCC = 5.0 Volts
Temperature = 27° C.

TABLE 3.3

| TRANSITION | | DELAY TIME (full IC) | |
|---|---|---|---|
| INPUT | OUTPUT | (nanoseconds) | CONDITIONS |
| L→H | H→L | 8.1 | VCC = 4.75 volts |
| H→L | L→H | 8.5 | Temp. = 55° C. |
| L→H | H→L | 8.7 | VCC = 4.75 volts |
| H→L | L→H | 9.1 | Temp. = 85° C. |
| L→H | H→L | 7.4 | VCC = 5.25 volts |
| H→L | L→H | 7.6 | Temp. = 0° C. |

Where:
H = logical one ("1")
L = logical zero ("0")

Figure 4:
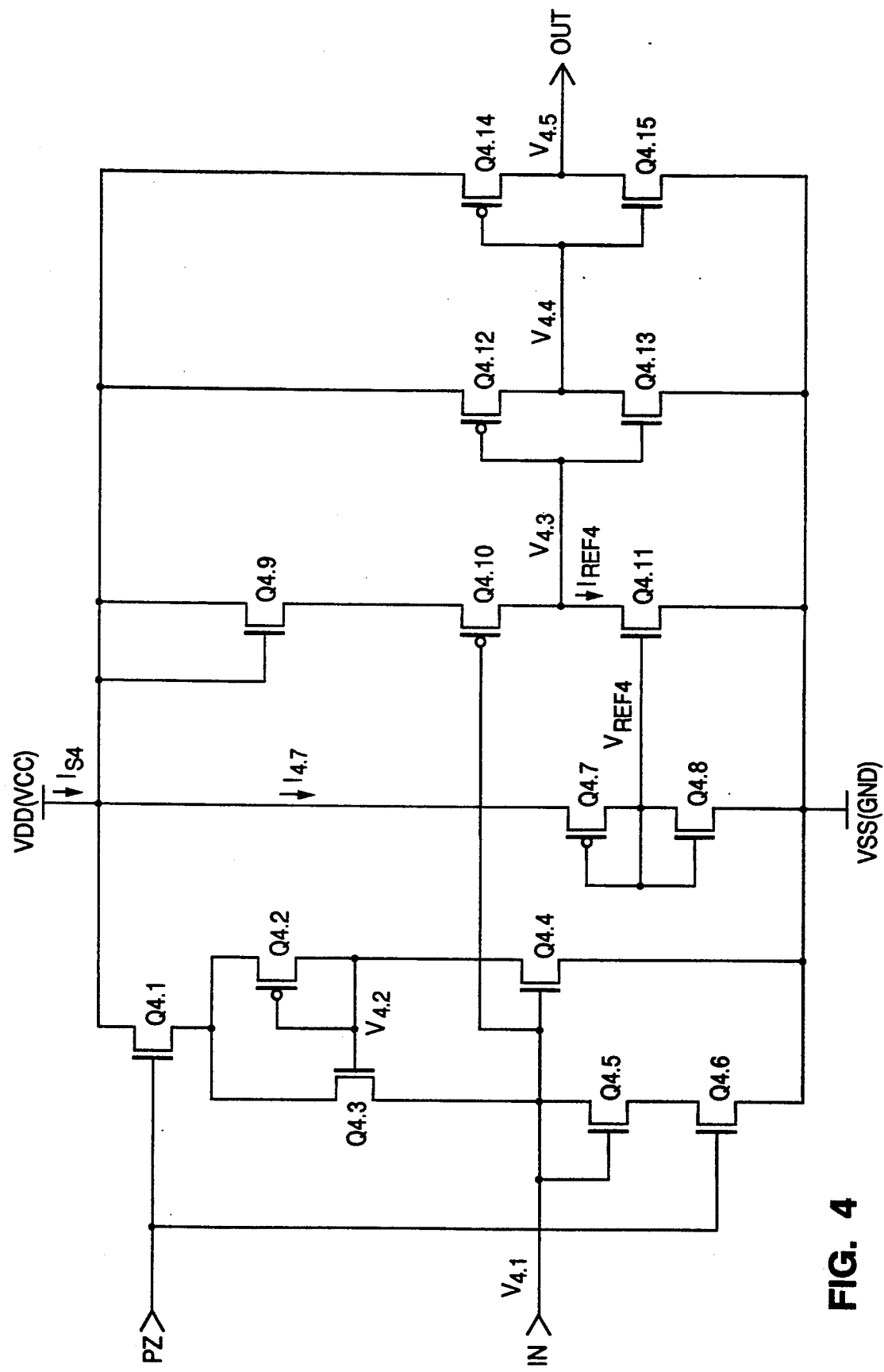
FIG. 4 is a schematic diagram of another alternative embodiment of a single-ended MOSFET sense amplifier in accordance with the present invention.

Referring to FIG. 4, an alternative embodiment of a single-ended MOSFET sense amplifier in accordance with the present invention includes pluralities of P-MOSFETs Q4.2, Q4.7, Q4.7, Q4.10, Q4.12, Q4.14, and N-MOSFETs Q4.1, Q4.3–Q4.6, Q4.8, Q4.11, Q4.13, Q4.15, connected substantially as shown. The MOSFET geometries and circuit performance characteristics are shown below in Tables 4.1-4.3. With the MOSFET geometries as shown below in Table 4.1, the active reference voltage $V_{REF4}$ is approximately 2.4 volts, and the active reference current $I_{4.7}$ is approximately 30 micro-amperes.

TABLE 4.1

| MOSFET | CHANNEL WIDTH (MICRONS) | CHANNEL LENGTH (MICRONS) |
|---|---|---|
| Q4.1 | 25 | 2 |
| Q4.2 | 20 | 2.5 |
| Q4.3 | 7 | 2.5 |
| Q4.4 | 15 | 2.5 |
| Q4.5 | 5 | 2.5 |
| Q4.6 | 10 | 2 |
| Q4.7 | 3 | 6 |
| Q4.8 | 3 | 12 |
| Q4.9 | 35 | 2 |
| Q4.10 | 20 | 3 |
| Q4.11 | 6 | 2.5 |
| Q4.12 | 6 | 2.5 |
| Q4.13 | 10 | 2.5 |
| Q4.14 | 10 | 2.5 |
| Q4.15 | 15 | 2.5 |

TABLE 4.2

| INPUT STATE | V4.1 (volts) | V4.2 (volts) | V4.3 (volts) | V4.4 (volts) | V4.5 (volts) | $I_{S4}$ (micro-amperes) |
|---|---|---|---|---|---|---|
| ERASE ("1") | 1.193 | 2.34 | 1.18 | 4.7 | 0 | 730 |
| PROGRAM ("0") | 1.068 | 2.5 | 2.04 | 0.5 | 5 | 850 |

Test Conditions:
VCC = 5.0 Volts
Temperature = 27° C.

TABLE 4.3

| TRANSITION | | DELAY TIME (full IC) (nanoseconds) | CONDITIONS |
|---|---|---|---|
| INPUT | OUTPUT | | |
| L→H | H→L | 7.8 | VCC = 4.75 volts |
| H→L | L→H | 8.4 | Temp. = 55° C. |
| L→H | H→L | 8.4 | VCC = 4.75 volts |
| H→L | L→H | 9.0 | Temp. = 85° C. |
| L→H | H→L | 7.2 | VCC = 5.25 volts |
| H→L | L→H | 7.7 | Temp. = 0° C. |

Where:
H = logical one ("1")
L = logical zero ("0")

As can be seen above in Tables 2.2, 3.2 and 4.2, the various embodiments of the single-ended MOSFET sense amplifiers shown in FIGS. 2, 3 and 4, respectively, display similar performance characteristics, and therefore have similar advantages as discussed above. However, by referring to Tables 2.3, 3.3 and 4.3, it can be seen that the embodiments shown in FIGS. 3 and 4 may not necessarily display as good of performance with respect to input-to-output (full IC) signal propagation delays as compared to the preferred embodiment shown in FIG. 2.

It should be understood that various alternatives to the embodiments of the present invention described herein can be employed in practicing the invention. It is intended that the following claims define the scope of the present invention, and that structures and methods within the scope of these claims and their equivalents be covered thereby.

What is claimed is:

1. A reference-controlled, single-ended sense amplifier, comprising:
   input amplifier means for receiving and amplifying a signal from a bit line and for providing an amplified input signal representing said bit line signal; and
   reference-controlled, single-ended amplifier means coupled to said input amplifier means for receiving a reference bias signal and said amplified input signal, and for providing a reference-controlled, single-ended digital output signal representing said bit line signal, wherein said reference-controlled, single-ended amplifier means comprises:
   a single-ended MOSFET inverter including a driver MOSFET for receiving said amplified input signal and a load MOSFET coupled to said driver MOSFET for receiving said reference bias signal; and
   a plurality of diode-connected MOSFETs for providing said reference bias signal, wherein said reference bias signal comprises a voltage.

2. A reference-controlled, single-ended complementary MOSFET sense amplifier, comprising:
   complementary MOSFET input amplifier means for receiving and amplifying a signal from a bit line and for providing an amplified input signal representing said bit line signal; and
   reference-controlled, single-ended complementary MOSFET amplifier means coupled to said complementary MOSFET input amplifier means for receiving a reference bias signal and said amplified input signal, and for providing a reference-controlled, single-ended digital output signal representing said bit line signal, wherein said reference-controlled, single-ended complementary MOSFET amplifier means comprises:
   a single-ended, complementary MOSFET inverter including a driver MOSFET for receiving aid amplified input signal and a load MOSFET coupled to said driver MOSFET for receiving said reference bias signal; and
   a plurality of diode-connected MOSFETs for providing said reference bias signal, wherein said reference bias signal comprises a voltage.

3. A reference-controlled, single-ended complementary MOSFET sense amplifier, comprising:
   complementary MOSFET input amplifier means for receiving and amplifying a signal from a bit line and for providing an amplified input signal representing said bit line signal; and
   reference-controlled, single-ended complementary MOSFET amplifier means coupled to said complementary MOSFET input amplifier means for receiving a reference-controlled bias signal and said amplified input signal, and for providing a reference-controlled, single-ended digital output signal representing said bit line signal, wherein said reference-controlled, single-ended complementary MOSFET amplifier means comprises:
   a single-ended, complementary MOSFET inverter including a driver MOSFET for receiving said amplified input signal and said reference-controlled bias signal; and
   a complementary MOSFET current mirror for providing said reference-controlled bias signal, wherein said reference-controlled bias signal comprises a current.

* * * * *

UNITED STATES PATENT AND TRADEMARK OFFICE
CERTIFICATE OF CORRECTION

PATENT NO. : 5,229,666

DATED : JULY 20, 1993

INVENTOR(S) : BAL S. SANDHU

It is certified that error appears in the above - identified patent and that said Letters Patent is hereby corrected as shown below:

In Col. 8, line 39, delete "aid" and replace with --said--.

Signed and Sealed this

Eighth Day of February, 1994

*Attest:*

BRUCE LEHMAN

*Attesting Officer*     *Commissioner of Patents and Trademarks*